(12) United States Patent
Sung et al.

(10) Patent No.: US 7,666,785 B2
(45) Date of Patent: Feb. 23, 2010

(54) METHOD FOR FABRICATING SEMICONDUCTOR DEVICE WITH INTERFACE BARRIER

(75) Inventors: Min-Gyu Sung, Ichon-shi (KR); Yong-Soo Kim, Ichon-shi (KR); Kwan-Yong Lim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 37 days.

(21) Appl. No.: 12/165,111

(22) Filed: Jun. 30, 2008

(65) Prior Publication Data

US 2009/0239376 A1    Sep. 24, 2009

(30) Foreign Application Priority Data

Mar. 21, 2008    (KR) .................. 10-2008-0026422

(51) Int. Cl.
*H01L 21/4763*    (2006.01)
(52) U.S. Cl. .................. 438/643; 438/627; 438/648; 438/653; 257/751; 257/E21.584
(58) Field of Classification Search ................ 438/627, 438/643, 648, 653; 257/751, E21.584
See application file for complete search history.

(56) References Cited

U.S. PATENT DOCUMENTS

| 4,141,022 | A | 2/1979 | Sigg et al. | |
|---|---|---|---|---|
| 6,127,269 | A * | 10/2000 | Liaw et al. | .................. 438/682 |
| 7,053,459 | B2 | 5/2006 | Yamamoto et al. | |
| 2003/0170942 | A1 | 9/2003 | Taguwa | |
| 2005/0070097 | A1 * | 3/2005 | Barmak et al. | .............. 438/653 |

FOREIGN PATENT DOCUMENTS

| KR | 1020020038273 A | 5/2002 |
|---|---|---|
| KR | 1020060083480 A | 7/2006 |

* cited by examiner

*Primary Examiner*—Charles D Garber
*Assistant Examiner*—Yasser A Abdelaziez
(74) *Attorney, Agent, or Firm*—Townsend and Townsend and Crew LLP

(57) ABSTRACT

A method for fabricating a semiconductor memory device includes forming a first layer, injecting a tungsten source gas and a silicon source gas simultaneously to form a tungsten silicide layer over the first layer, forming a tungsten nitride layer over the tungsten silicide layer without a post purge process of additionally supplying the silicon source gas, and forming a second layer over the tungsten nitride layer.

19 Claims, 11 Drawing Sheets

METHOD FOR FABRICATING SEMICONDUCTOR DEVICE WITH INTERFACE BARRIER

CROSS-REFERENCE TO RELATED APPLICATIONS

The present invention claims priority of Korean patent application number 2008-0026422, filed on Mar. 21, 2008, which is incorporated by reference in its entirety.

BACKGROUND OF THE INVENTION

The present invention relates to a method for fabricating a semiconductor device, and more particularly, to a method for fabricating a semiconductor device interconnection with an interface barrier.

Recently, a signal delay due to resistance-capacitance (RC) delay of an interconnection (such as a gate line, a bit line and a metal line) has increased demands for a new material and structure of an interconnection used in a high-speed semiconductor memory device.

In particular, to reduce the effect of the RC delay, a poly metal gate structure has been proposed, in which a gate has a multi-layered structure with a polysilicon layer and a tungsten layer, i.e., W/poly-Si structure stacked in sequence. The poly metal gate structure employing tungsten is called a tungsten poly gate structure.

In such a tungsten poly gate structure, the barrier layer is an interface barrier used to suppress an interface reaction between the tungsten layer and the polysilicon layer. A tungsten nitride (WN) layer or a multi-layered structure with a tungsten silicide (WSi) layer and a WN layer is used as the barrier layer of the tungsten poly gate structure.

FIG. 1 illustrates the measured Kelvin contact resistance (Kelvin Rc) between layers according to a kind of a barrier layer in a conventional tungsten poly gate structure. The reference symbol 'A' indicates the Kelvin contact resistance of a tungsten poly gate structure where a tungsten nitride layer is interposed between a polysilicon layer and a tungsten layer, and a reference symbol 'B' indicates the Kelvin contact resistance of a tungsten poly gate structure where a tungsten silicide layer and a tungsten nitride layer are interposed between a polysilicon layer and a tungsten layer.

Referring to FIG. 1, it can be observed that the interface resistance is high for case A where only the tungsten nitride layer is interposed between the polysilicon layer and the tungsten layer. This is because a silicon-nitrogen (Si—N) reaction is triggered between the tungsten nitride layer and the polysilicon layer. In contrast, Si—N reaction is somewhat suppressed in the case B where the tungsten silicide layer is used as the barrier layer.

From the measurement results shown in FIG. 1, it can be seen that a multi-layered barrier with the tungsten silicide layer and the tungsten nitride layer is suitable for memory devices with high-speed performance. However, it can be observed from a micrographic view (see FIG. 2) that the multi-layered barrier with the tungsten silicide layer and the tungsten nitride layer does not sufficiently suppress the Si—N reaction after performing a subsequent thermal process.

FIG. 2 illustrates a micrographic view of a tungsten poly gate structure having a multi-layered barrier with a tungsten silicide layer and a tungsten nitride layer after performing a subsequent thermal process.

Referring to FIG. 2, the subsequent thermal process triggers a reaction at an interface between the tungsten silicide layer and the tungsten nitride layer. For example, WSiN reaction and Si—N reaction occur at the interface. The WSiN reaction does not have an effect on interface resistance because it is a metallic reaction. However, the Si—N reaction increases interface resistance because it is a dielectric reaction.

The Si—N reaction occurs due to agglomeration of the tungsten silicide layer during the subsequent thermal process. This is because of a phase transformation in the tungsten silicide layer when silicon (Si) diffuses from the underlying polysilicon layer into the tungsten silicide layer during the subsequent thermal process, and resultantly the tungsten silicide layer agglomerates to release a film stress caused by the phase transformation. In this way, an interface, which directly contacts both the polysilicon layer and the tungsten nitride layer, exists in a vacant space between agglomerated tungsten silicide layers, thus triggering the Si—N dielectric reaction.

As seen from FIG. 2, even though the multi-layered barrier with the tungsten silicide layer and the tungsten nitride layer is used, the agglomeration of the tungsten silicide layer causes the Si—N reaction to occur between the tungsten nitride layer and the polysilicon layer, resulting in an increase in interface resistance. This leads to RC delay in a transistor so that it becomes difficult to satisfy the requirements for high-speed memory.

Such Si—N reaction caused by the agglomeration of tungsten silicide is not limited to a gate forming process, but also occurs during other line forming processes employing the multi-layered barrier with the tungsten silicide layer and the tungsten nitride layer, for example, a metal line forming process or a bit line forming process.

SUMMARY OF THE INVENTION

Embodiments of the present invention relate to a method for fabricating a semiconductor device that can suppress Si—N reaction between a tungsten silicide layer and a tungsten nitride layer during a process of forming a multi-layered barrier with the tungsten silicide layer and the tungsten nitride layer.

In accordance with an aspect of the present invention, there is provided a method for fabricating a semiconductor memory device. The method includes forming a first layer, injecting a tungsten source gas and a silicon source gas simultaneously to form a tungsten silicide layer over the first layer, forming a tungsten nitride layer over the tungsten silicide layer without a post purge process of additionally supplying the silicon source gas, and forming a second layer over the tungsten nitride layer.

In accordance with another aspect of the present invention, there is provided a method for fabricating a semiconductor memory device. The method includes forming a first layer, forming a tungsten silicide layer over the first layer through a post purge free process, forming a tungsten nitride layer over the tungsten silicide layer, the tungsten nitride layer having a minimum nitrogen content and thickness allowing the tungsten nitride to maintain amorphous characteristics, and forming a second layer over the tungsten nitride layer.

DESCRIPTION OF SPECIFIC EMBODIMENTS

Specific embodiments of the present invention relate to a method capable of reducing an interface resistance by suppressing Si—N reaction between a tungsten silicide layer and a tungsten nitride layer as well as maintaining a barrier function in fabrication of a semiconductor device adopting a multi-layered interface barrier with the tungsten silicide layer and the tungsten nitride layer.

Figure 1:
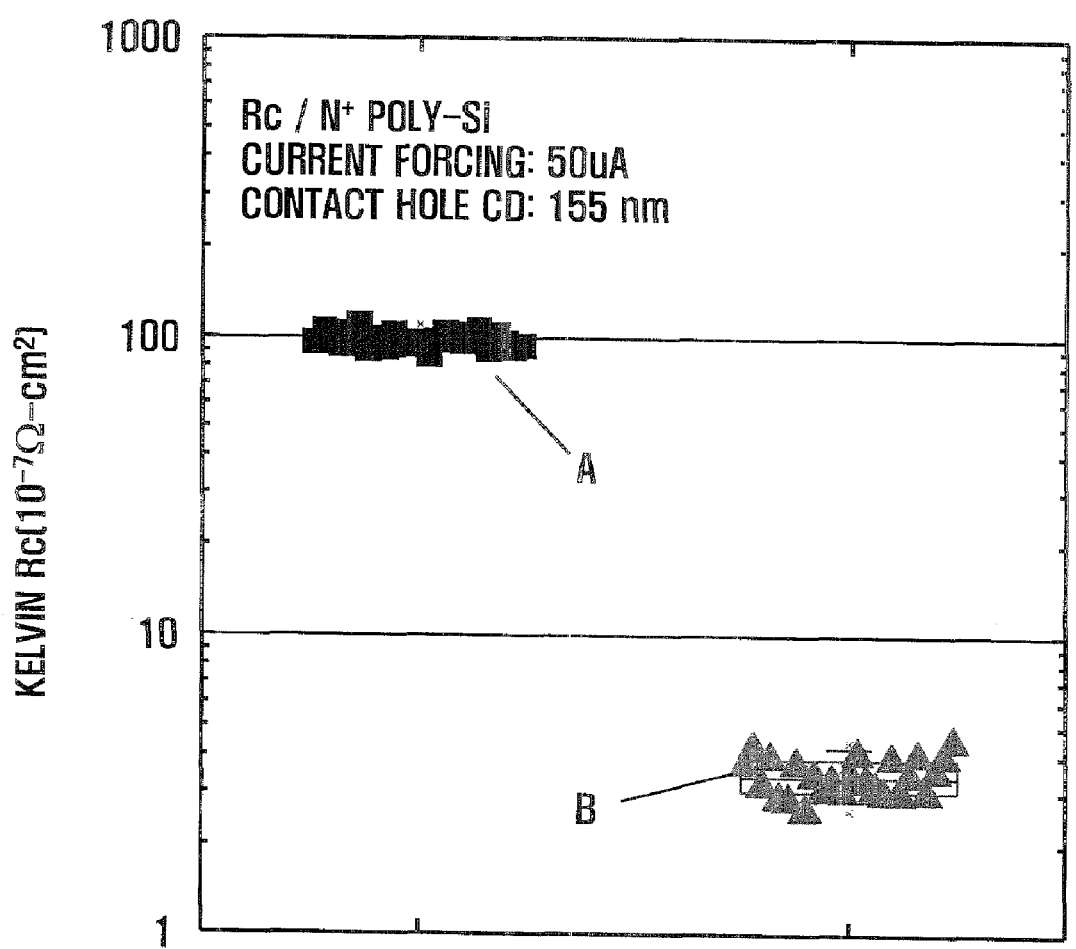
FIG. 1 illustrates the measured Kelvin contact resistance (Kelvin Rc) between layers according to a kind of a barrier layer in a conventional tungsten poly gate structure.
Figure 2:
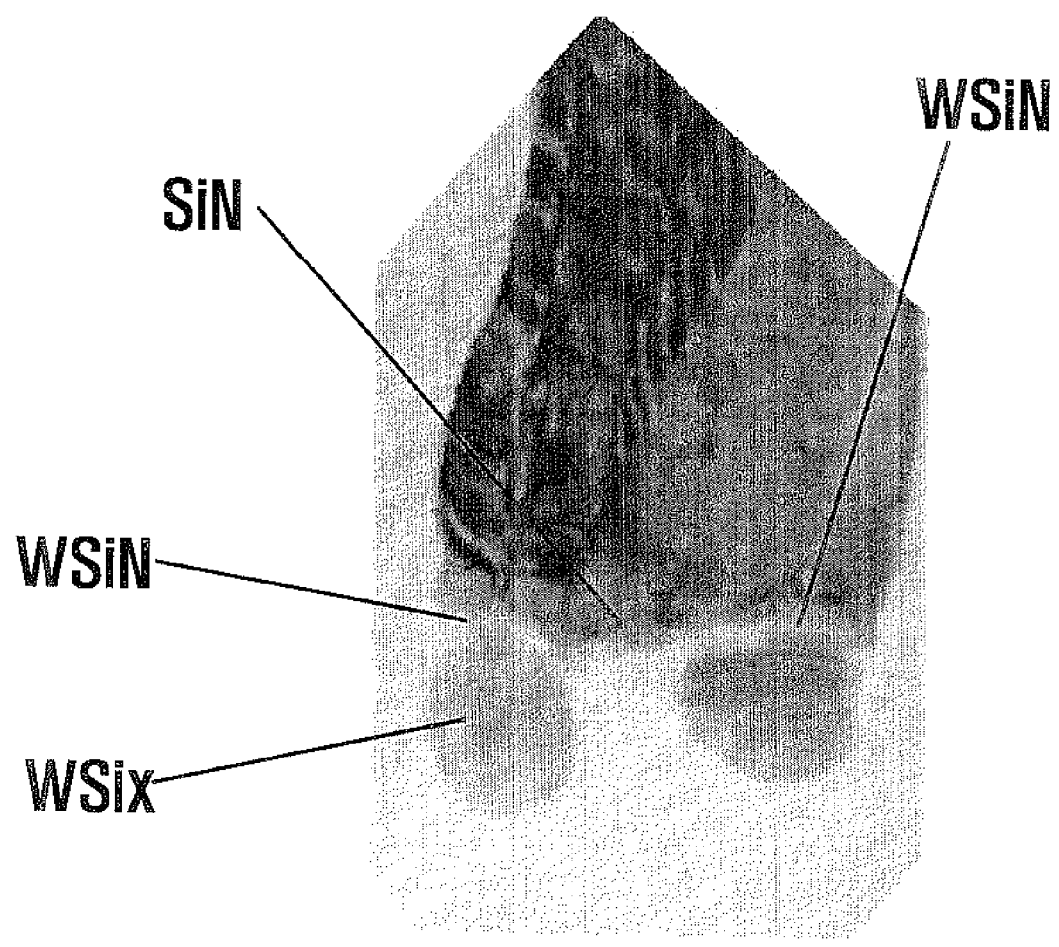
FIG. 2 illustrates a micrographic view of a tungsten poly gate structure having a multi-layered barrier with a tungsten silicide layer and a tungsten nitride layer after performing a subsequent thermal process.
Figure 3A:
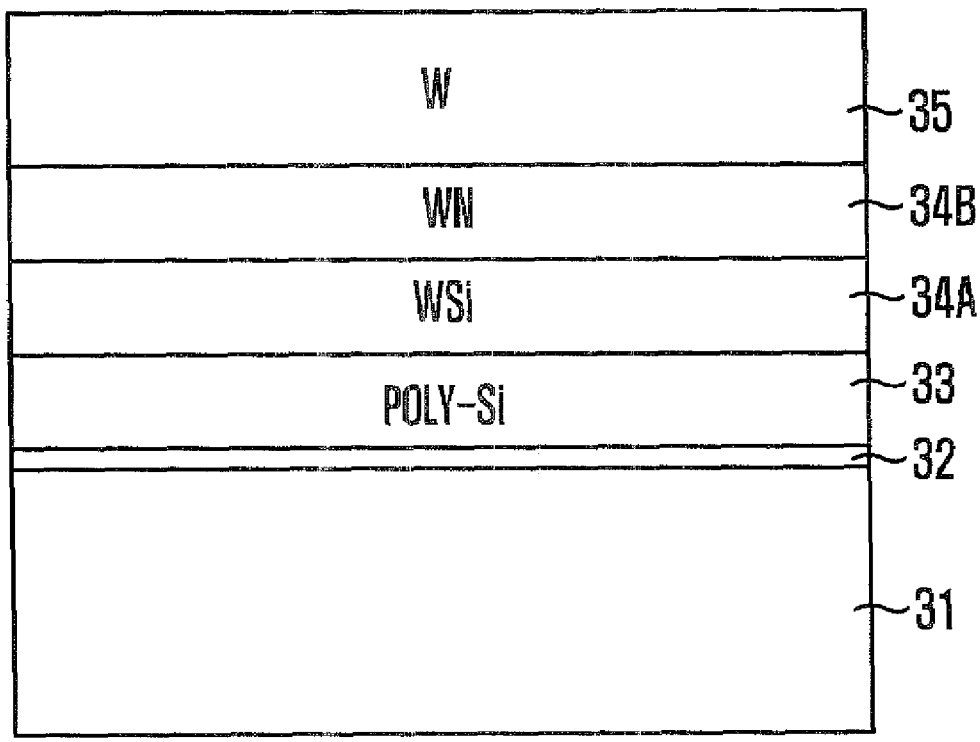
FIG. 3A illustrates a cross-sectional view of a semiconductor device including a barrier layer in accordance with an embodiment of the present invention.

FIG. 3A illustrates a cross-sectional view of a semiconductor device including a barrier layer in accordance with an embodiment of the present invention.

Referring to FIG. 3A, an insulation layer 32 is formed over a substrate 31, and a first layer 33 and a second layer 35 are disposed on the insulation layer 32. The substrate 31 is of semiconductor material, e.g., silicon, in the present embodiment. The first layer 33 may include a layer made mainly of silicon, for example, polysilicon or polysilicon germanium (Poly-Si Ge). The second layer 35 may include a metal layer made of tungsten (W), ruthenium (Ru), aluminum (Al), platinum (Pt), or the like.

A barrier layer is interposed between the first layer 33 and the second layer 35, and serves as a barrier suppressing an interface reaction between the first and second layers 33 and 35. The barrier layer may be a multi-layered structure of a tungsten silicide (WSi) layer 34A and a tungsten nitride (WN) layer 34B.

Specifically, FIG. 3A illustrates a tungsten poly gate structure of a semiconductor device in accordance with the present invention. To suppress Si—N reaction between the tungsten silicide layer 34A and the tungsten nitride layer 34B in the semiconductor device, two inventive methods are proposed herein. One method is to control process conditions during deposition of the tungsten silicide layer 34A, and the other method is to control process conditions during deposition of the tungsten nitride layer 34B.

Hereafter, a description will be made for the method of suppressing Si—N reaction by controlling process conditions during deposition of the tungsten silicide layer. The tungsten silicide layer is formed using a low pressure chemical vapor deposition (LPCVD) method, where a tungsten source gas and a silicon source gas are supplied into a process chamber (not shown). The process chamber may be one selected from various deposition chambers that are on market. A tungsten hexafluoride ($WF_6$) gas may be used for the tungsten source gas, and dichlorosilane ($SiH_2Cl_2$) gas or silane ($SiH_4$) gas may be used for the silicon source gas. The source gas of $SiH_2Cl_2$ or $SiH_4$ reacts with the tungsten gas to deposit the tungsten silicide layer on the first layer 33.

In general, deposition of the tungsten silicide layer is performed in such a way that the tungsten source gas and the silicon source gas react with each other, and a post purge process is then performed by additionally supplying the silicon source gas for a predetermined time at the same temperature, thereby thinly capping silicon on a surface. Since the post purge process is performed using mainly silane ($SiH_4$) gas, it is often called '$SiH_4$ post purge'. The post purge process may be performed using a silicon source gas other than silane in other embodiments.

The post purge process prevents the surface of a layer from being oxidized when the layer is exposed to air, and also suppresses thermal stress in the tungsten silicide layer in a subsequent thermal process. However, when the post purge process is applied, silicon is excessively distributed on the surface of the tungsten silicide layer, thus accelerating the Si—N reaction between extra silicon on the surface of the tungsten silicide layer and nitrogen decomposed from the tungsten nitride layer.

Therefore, in this embodiment of the present invention, the post purge process is omitted to minimize the Si—N reaction during the deposition of the tungsten silicide layer (this is referred to as 'post purge free process' in brief), thus preventing silicon from being excessively distributed on the surface of the tungsten silicide layer. In this case, a native oxide may be formed over the tungsten silicide layer. To solve the problem of the native oxide layer, therefore, a delay time (e.g., 2 hours or less) from the deposition of the tungsten silicide layer to the deposition of the tungsten nitride layer is reduced to the minimum. This is done to prevent the formation of a native oxide layer on a surface of the tungsten silicide layer. A cleaning process can also be performed to remove the native oxide layer. The delay time may be set to a range of approximately 1 second to approximately 2 hours, and the cleaning may be performed through wet cleaning using a wet chemical. In one embodiment, the delay time is no more than 5 minutes or 10 minutes. In another embodiments, the delay time is no more than 15 minutes or 30 minutes.

As such, if the post purge process is omitted, it is possible to prevent silicon from being excessively distributed on the surface of the tungsten silicide layer. Accordingly, this can suppress the Si—N reaction between extra silicon on the surface of the tungsten silicide layer and nitrogen decomposed from the tungsten nitride layer.

Further, if the post purge process is omitted, it is possible to prevent the formation of a native oxide layer on the surface of the tungsten silicide layer by minimizing the delay time (e.g., 2 hours or less) from the deposition of the tungsten silicide layer to the deposition of the tungsten nitride layer or by performing a cleaning process.

Alternatively, to minimize the Si—N reaction, a ratio of tungsten to silicon (W/Si ratio) can be increased to reduce silicon concentration by varying a flow rate of the tungsten source or silicon source during the deposition of the tungsten silicide layer. In this method, however, a WSiN metallic reaction between the tungsten silicide layer and the tungsten nitride layer is suppressed, leading to an increase in interface resistance undesirably.

In another embodiment, a description will be made for a method of suppressing Si—N reaction by controlling process conditions during deposition of the tungsten nitride layer.

The tungsten nitride layer changes phase depending on nitrogen content. If the nitrogen content is approximately 10% or less, the tungsten nitride layer has α-W or β-W crystalline phase similar to that of a tungsten layer. However, if the nitrogen content is in the range of approximately 10% to approximately 50%, the tungsten nitride layer has amorphous characteristics which serve as a barrier layer. If the nitrogen content is greater than approximately 50%, the tungsten nitride layer has $W_2N$ or WN crystalline phase. As the nitrogen content is increased, the tungsten nitride layer changes phase in the following sequence; α-W, β-W, amorphous WNx (nitrogen content is in the range of approximately 10-50%), crystalline $W_2N$, and crystalline WN.

Accordingly, the tungsten nitride layer having a small amount of nitrogen content, for example, in the range of approximately 10% to approximately 50%, may be deposited to minimize the Si—N reaction between the tungsten nitride layer and the tungsten silicide layer while maintaining the amorphous characteristics of the tungsten nitride layer. Alternatively, to minimize the Si—N reaction between the tungsten nitride layer and the tungsten silicide layer while maintaining the amorphous characteristics of the tungsten nitride layer, the thickness of the tungsten nitride layer can be controlled.

For example, when the tungsten nitride layer has a thickness ranging from approximately 10 Å to approximately 50 Å, it exhibits the same effect as the tungsten nitride layer having the nitrogen content ranging from approximately 10% to approximately 50%.

In accordance with the description above, it is possible to minimize Si—N reaction between the tungsten nitride layer and the underlying tungsten silicide layer as well as to maintain the amorphous characteristics of the tungsten nitride layer when the tungsten nitride layer has no more than a given amount of nitrogen content (hereinafter referred to as "minimum nitrogen content condition"), or no more than a given thickness (hereinafter referred to as "minimum thickness"), or both. In the present embodiment, the tungsten nitride layer has the minimum nitrogen content of no more than approximately 10% to approximately 50%, and/or the minimum thickness in the range of approximately 10 Å to approximately 50 Å.

In another embodiment the Si—N reaction can also be suppressed by simultaneously controlling process conditions in deposition of the tungsten silicide layer and process conditions in deposition of the tungsten nitride layer. The post purge process is omitted in the deposition of the tungsten silicide layer, and further the tungsten nitride layer is formed to satisfy the minimum nitrogen content condition or the minimum thickness condition or both of the two conditions that allows the tungsten nitride layer to maintain amorphous characteristics.

First, the post purge process is omitted to minimize the Si—N reaction during the deposition of the tungsten silicide layer and delay time is minimized or a cleaning process is performed as described in the embodiment above. The tungsten nitride layer having minimum nitrogen content, for example, in the range of approximately 10% to approximately 50%, may be deposited to minimize the Si—N reaction between the tungsten nitride layer and the tungsten silicide layer while maintaining the amorphous characteristics of the tungsten nitride layer.

Further, to minimize the Si—N reaction between the tungsten nitride layer and the tungsten silicide layer while maintaining the amorphous characteristics of the tungsten nitride layer, the tungsten nitride layer is formed to have a thickness ranging from approximately 10 Å to approximately 50 Å. In one embodiment, the tungsten nitride layer has the minimum thickness of no more than approximately 30 Å. Consequently, the Si—N reaction can be more effectively suppressed by omitting the post purge process and controlling the minimum nitrogen content condition, the minimum thickness condition or both of the two conditions.

In accordance with the description above, it is possible to suppress the Si—N reaction at an interface between the tungsten silicide layer and the tungsten nitride layer by applying the method of omitting the post purge process, or the method of controlling the minimum nitrogen content and/or the minimum thickness allowing the tungsten nitride layer to maintain amorphous characteristics. Furthermore, the Si—N reaction can be more effectively suppressed by applying the two methods at the same time.

Figure 3B:
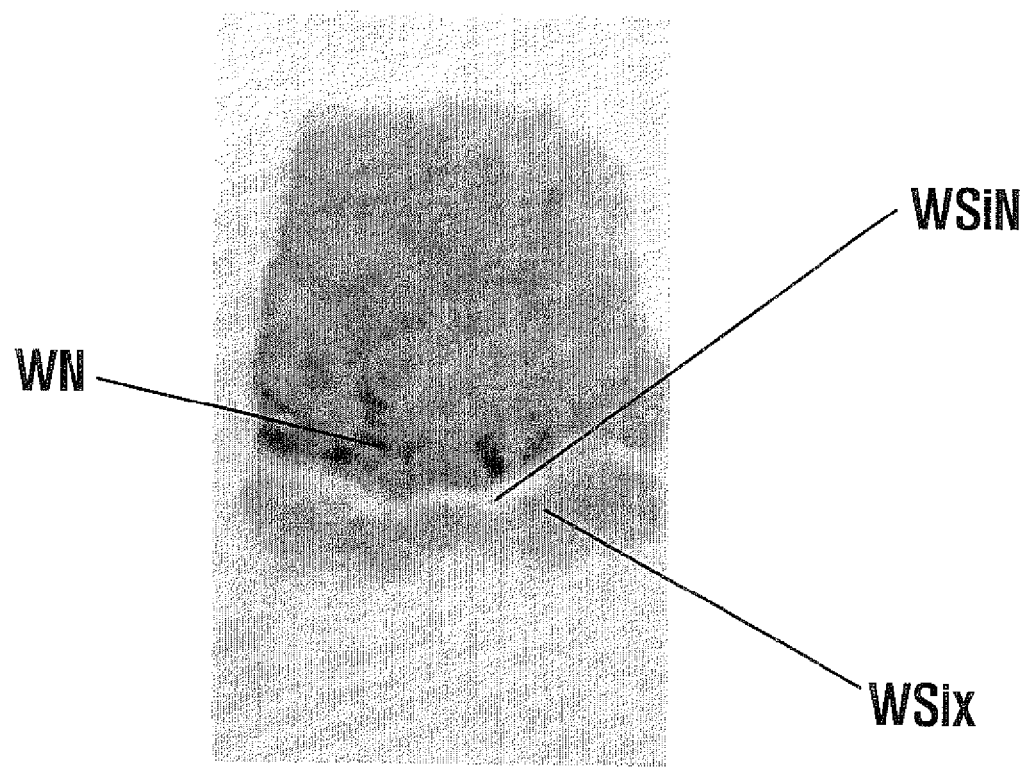
FIG. 3B is a micrographic view of a tungsten poly gate structure having a tungsten nitride layer with a minimum nitrogen content which is prepared through a $SiH_4$ post purge free process.

FIG. 3B is a micrographic view of a tungsten poly gate structure having a tungsten nitride layer with a minimum nitrogen content which is prepared through a $SiH_4$ post purge free process.

Referring to FIG. 3B, it can be observed that WSiN reaction occurs over the entire interface between the tungsten silicide ($WSi_x$) layer and the tungsten nitride (WN) layer. That is, there is no opened space (or void) in the tungsten silicide layer, and the tungsten silicide layer is very uniformly formed.

Figure 4:
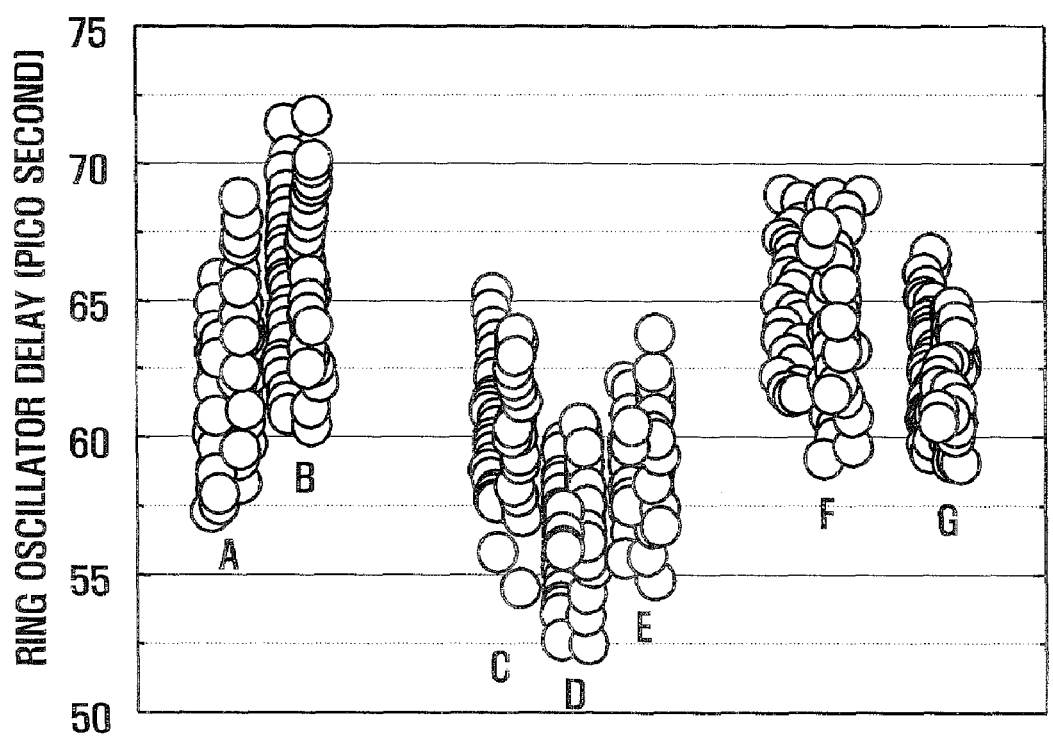
FIG. 4 illustrates an electrical signal delay of a transistor, which is measured after performing a process on a tungsten silicide layer and a tungsten nitride layer under various process conditions.

FIG. 4 illustrates an electrical signal delay of a transistor, which is measured after performing a process on a tungsten silicide layer and a tungsten nitride layer under various process conditions.

References symbol A shows measurement results of a tungsten poly gate structure prepared by a conventional method where the tungsten silicide layer is deposited, the $SiH_4$ post purge is then performed, and the tungsten nitride layer is deposited. Reference symbol B shows measurement results of a tungsten poly gate structure obtained by increasing the silicon content in the tungsten silicide layer as compared to the case A. Reference symbol C shows measurement results of a tungsten poly gate structure obtained by reducing the nitrogen content in the tungsten nitride layer as compared to the case A. The reference symbol D shows measurement results of a tungsten poly gate structure prepared by a method where the $SiH_4$ post purge process is omitted in deposition of the tungsten silicide layer and the nitrogen content is reduced in deposition of the tungsten nitride layer. The reference symbol E shows measurement results of a tungsten poly gate structure prepared by a method where the $SiH_4$ post purge process is omitted in deposition of the tungsten silicide layer. The reference symbol F shows measurement results of a tungsten poly gate structure obtained by increasing the tungsten content in the tungsten silicide layer as compared to the case A. The reference symbol G shows measurement results of a tungsten poly gate structure obtained by reducing the thickness of the tungsten nitride layer as compared to the case A.

Referring to FIG. 4, the delay values are increased in the case B where the silicon content is increased in deposition of the tungsten silicide layer, the case F where the tungsten content is increased in deposition of the tungsten silicide layer, and the case G where the thickness of the tungsten nitride layer is reduced. In contrast, it can be observed that delay values are considerably decreased in the case E where the SiH$_4$ post purge process is not performed after deposition of the tungsten silicide layer, the case C where the nitrogen content is reduced in deposition of the tungsten nitride layer, and the case D where the nitrogen content is reduced in deposition of the tungsten nitride layer and the SiH$_4$ post purge process is also omitted. In particular, it can be observed that the delay values are much lower in the case D than the cases C and E. If the process condition of the case G is added to the condition of the case E, it is expected that the delay value is further delayed.

Figure 5:
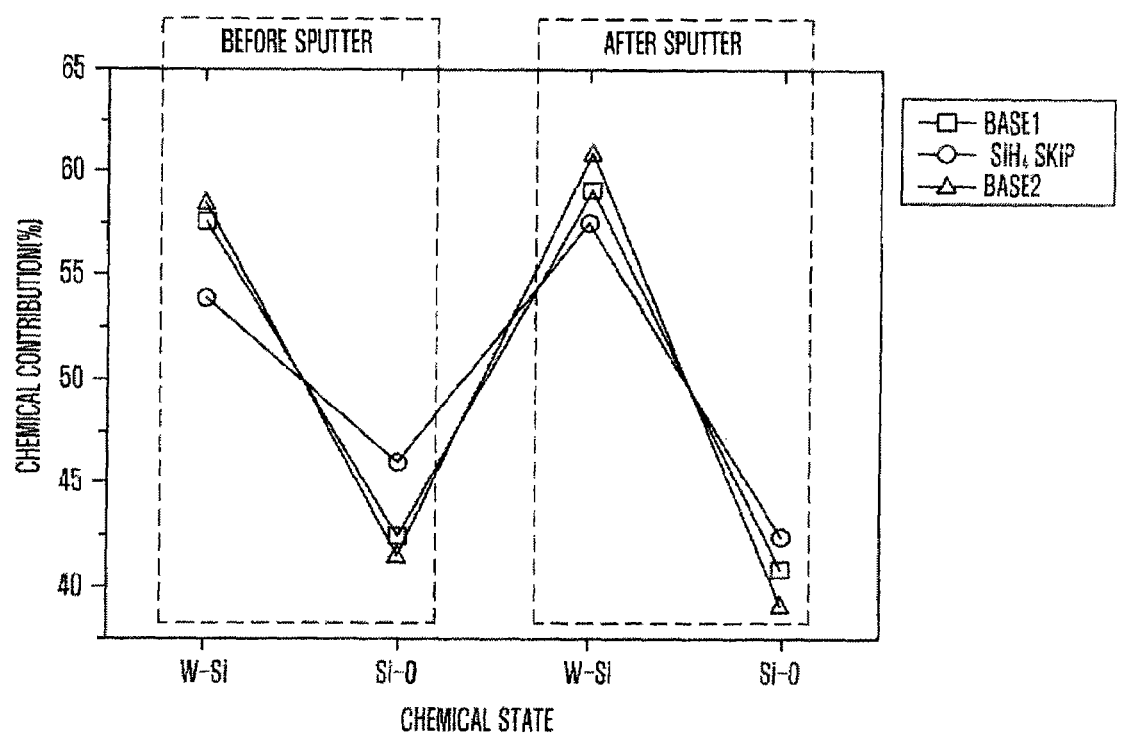
FIG. 5 illustrates x-ray photoelectron spectroscopy (XPS) analysis results according to whether the $SiH_4$ post purge process is performed during deposition of the tungsten silicide layer.

FIG. 5 illustrates x-ray photoelectron spectroscopy (XPS) analysis results according to whether the SiH$_4$ post purge process is performed during deposition of the tungsten silicide layer. Specifically, FIG. 5 illustrates Si2p chemical contribution versus a chemical state before and after sputtering.

Referring to FIG. 5, in terms of Si2p chemical contribution, a post purge free specimen, which is represented as 'SiH$_4$ Skip', has fewer W—Si species than 'base1' and 'base2' specimens but has more Si—O species than the 'base1' and 'base2' specimens, respectively. Here, the 'base1' and 'base2' specimens are prepared for comparison with the 'SiH$_4$ Skip' specimen for the sake of convenience.

The following table 1 shows atomic concentration after sputtering.

TABLE 1

| Specimen | O1s | Si2p | W4f |
|---|---|---|---|
| base1 | 45.6 | 49.2 | 5.2 |
| SiH$_4$ skip | 48.0 | 46.8 | 5.3 |
| base2 | 45.9 | 48.9 | 5.2 |

In terms of the atomic concentration (%), it can be seen that the post purge free specimen (SiH$_4$ skip) has relatively small Si2p atomic concentration but has high O1s atomic concentration. As seen from the results of FIG. 5 and Table 1, it can be seen that the post purge process slightly suppresses the formation of oxidized species on a surface.

Figure 6A:
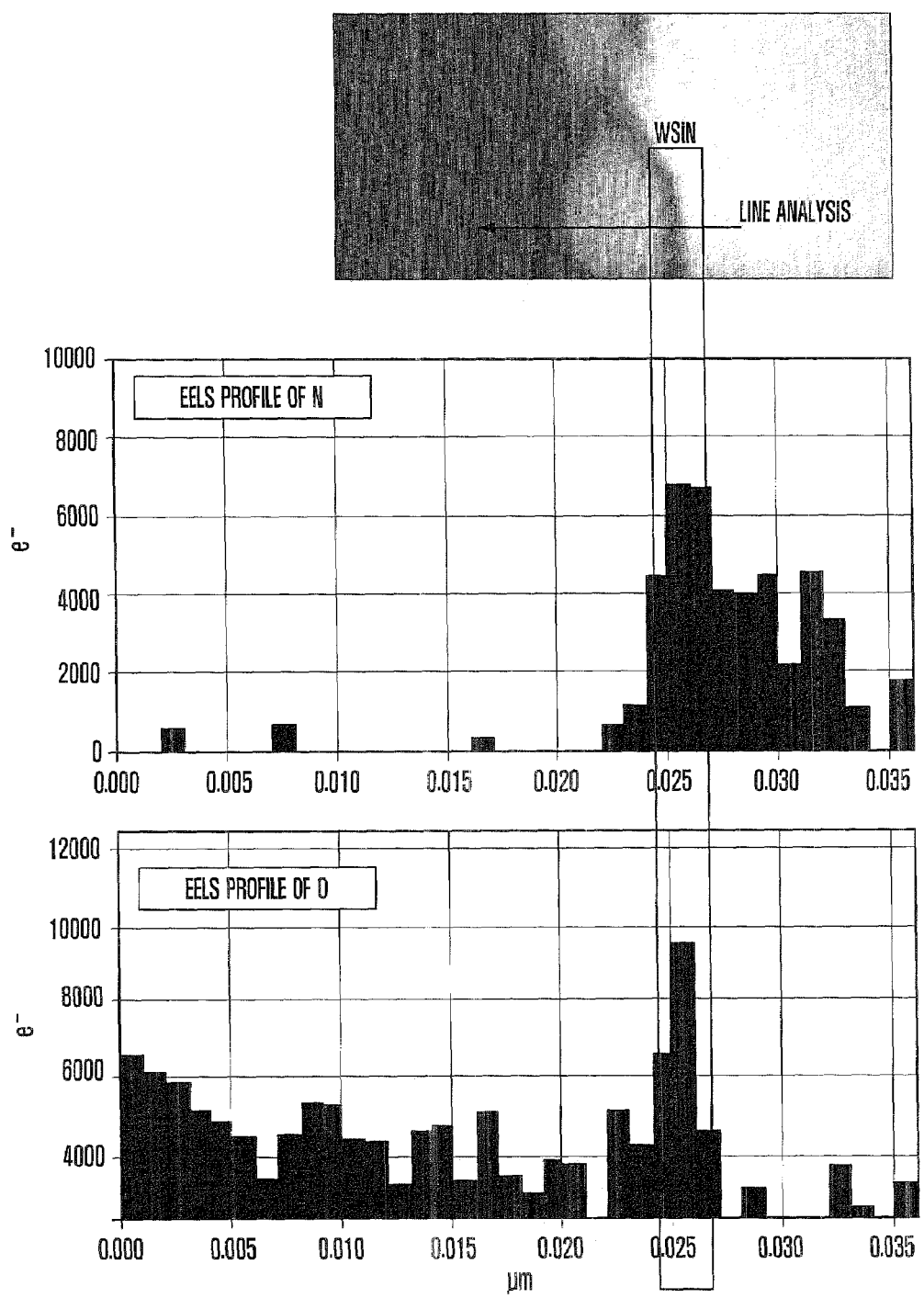
FIG. 6A illustrates accumulation results of nitrogen and oxygen when the $SiH_4$ post purge is performed.

FIG. 6A illustrates accumulation results of nitrogen and oxygen when the SiH$_4$ post purge is performed.

Referring to FIG. 6A, it can be seen that nitrogen does not penetrate the tungsten silicide layer, but oxygen is piled up in the tungsten silicide layer.

Figure 6B:
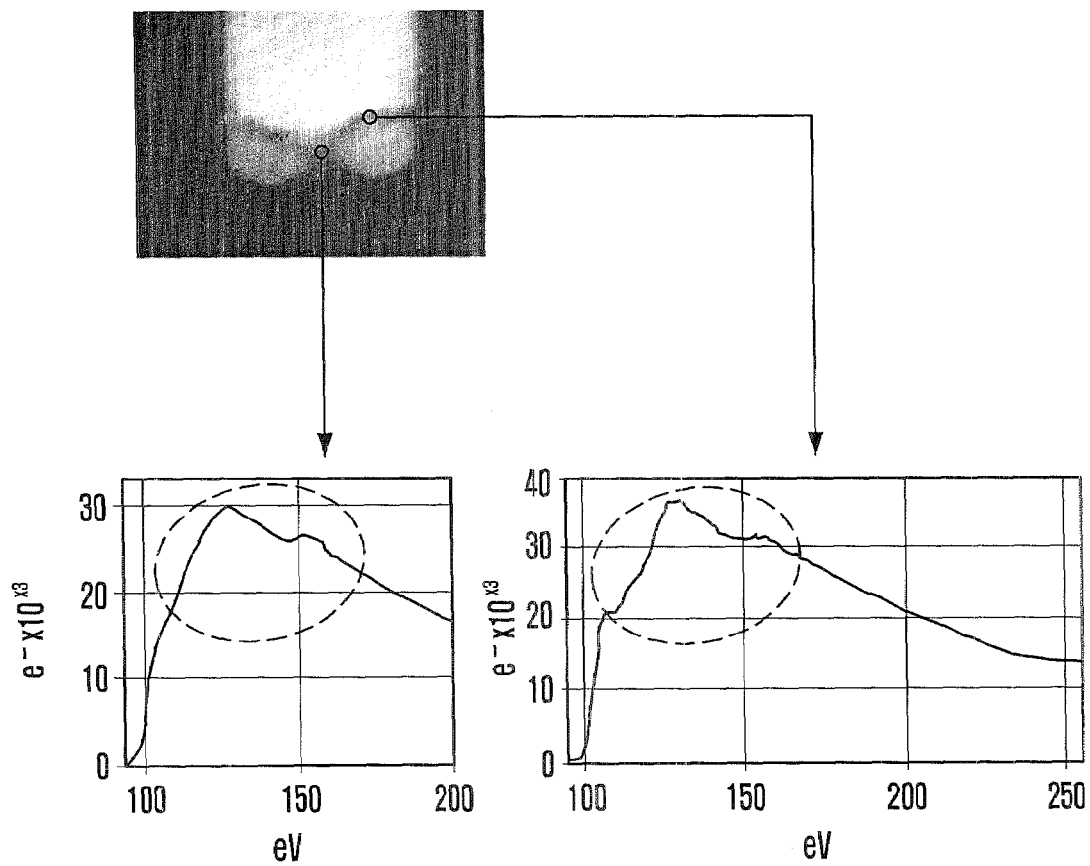
FIG. 6B illustrates silicon peak points of an opened region of the tungsten silicide layer at an interface between the tungsten silicide layer and the tungsten nitride layer when the $SiH_4$ post purge is performed.

FIG. 6B illustrates silicon peak points of an opened region of the tungsten silicide layer at an interface between the tungsten silicide layer and the tungsten nitride layer when the SiH$_4$ post purge is performed.

Referring to FIG. 6B, the Si peaks of the opened region of the tungsten silicide layer at the interface between the tungsten silicide layer and the tungsten nitride layer have different profiles. That is, a WSiN layer is not normally formed in the opened region of the tungsten silicide layer.

Figure 7A:
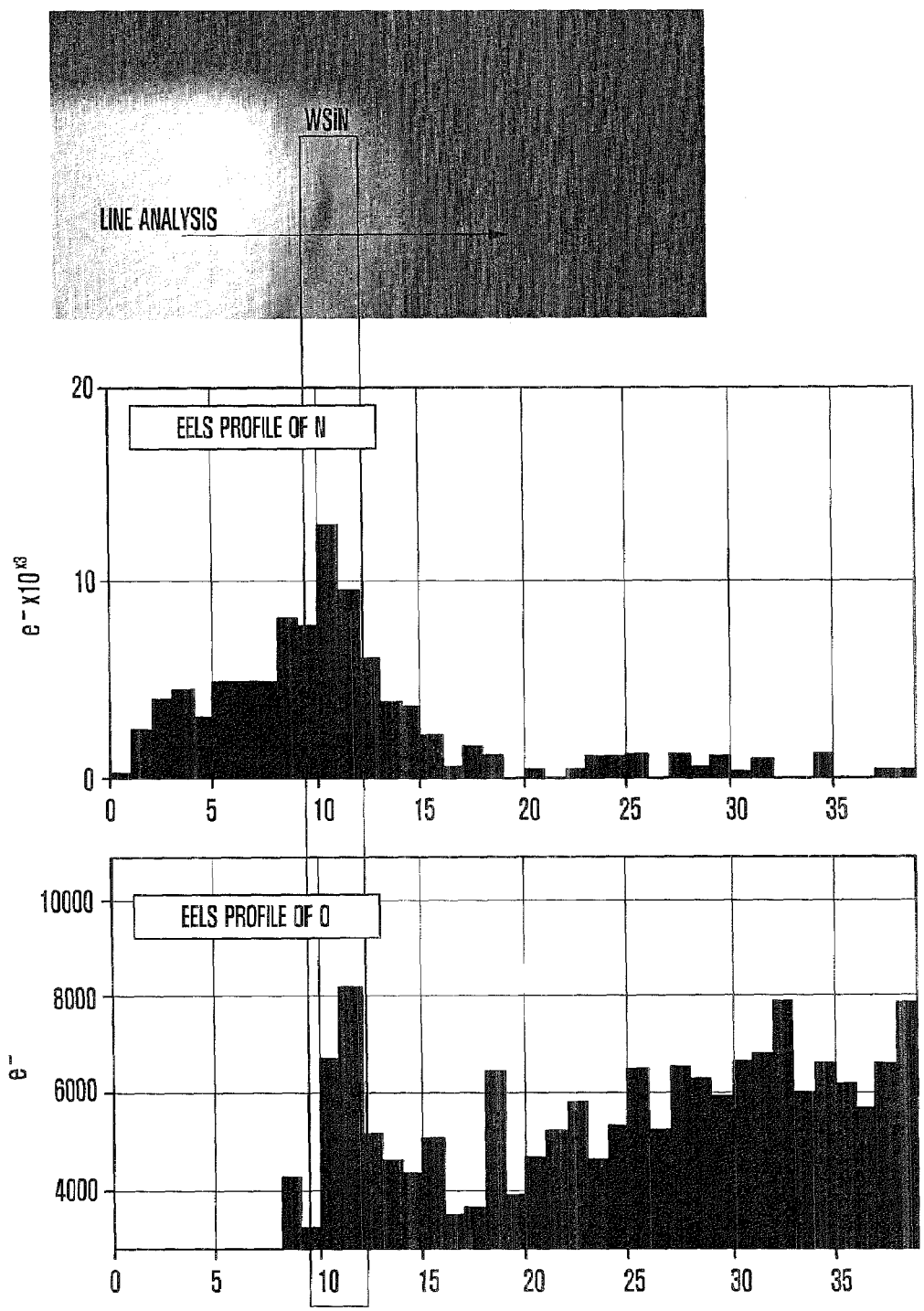
FIG. 7A illustrates accumulation results of nitrogen and oxygen when the $SiH_4$ post purge process is omitted.

FIG. 7A illustrates accumulation results of nitrogen and oxygen when the SiH$_4$ post purge process is omitted.

Referring to FIG. 7A, nitrogen is rarely observed in comparison with FIG. 6A. The nitrogen is distributed broadly from the WSiN layer. Oxygen is broadly distributed in a region except for the tungsten silicide layer.

Figure 7B:
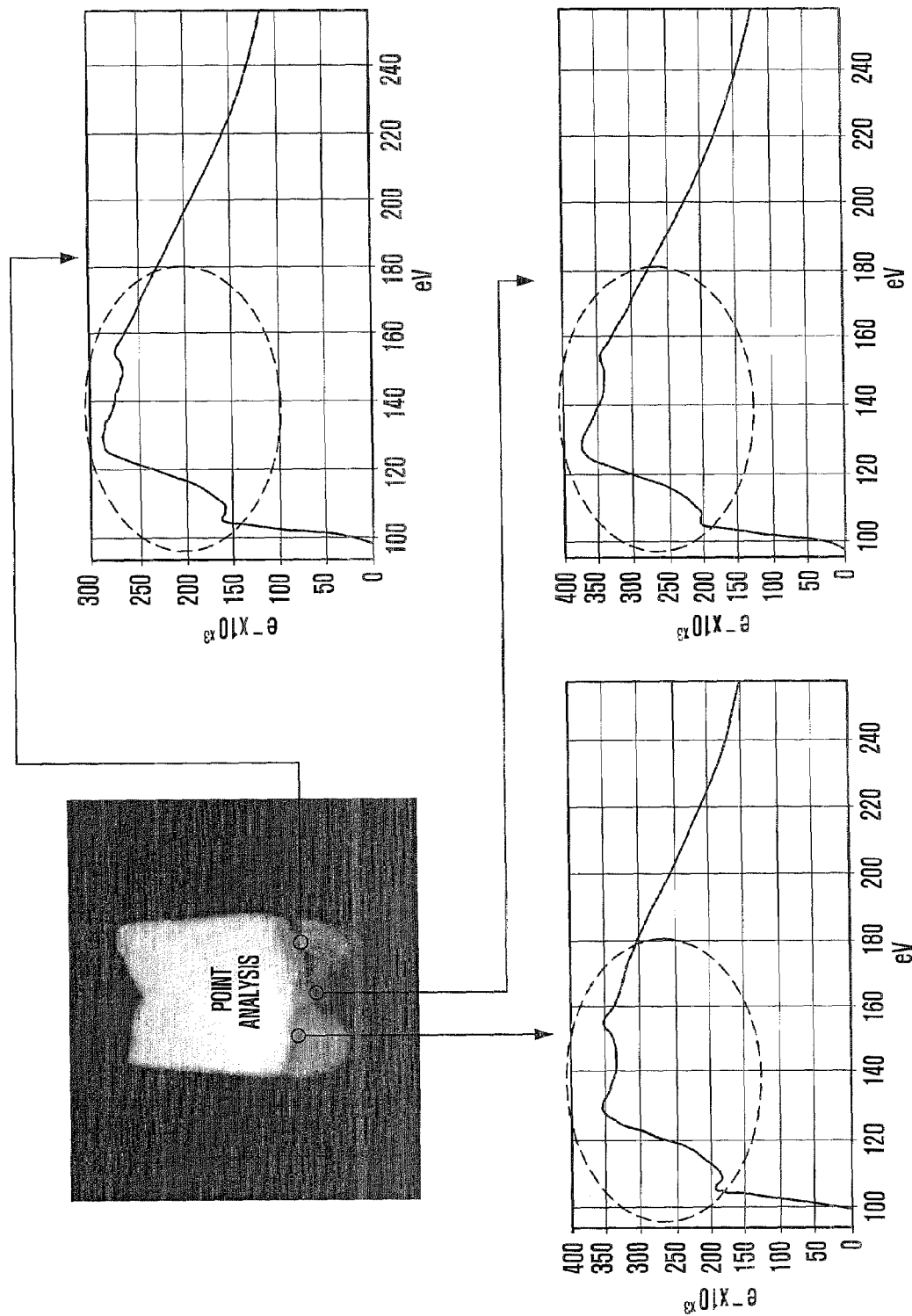
FIG. 7B illustrates Si peaks of an opened region of the tungsten silicide layer at an interface between the tungsten silicide layer and the tungsten nitride layer when the $SiH_4$ post purge process is omitted.

FIG. 7B illustrates Si peaks of an opened region of the tungsten silicide layer at an interface between the tungsten silicide layer and the tungsten nitride layer when the SiH$_4$ post purge process is omitted.

Referring to FIG. 7B, from comparison results of Si peaks of the opened region of the tungsten silicide layer at the interface between the tungsten silicide layer and the tungsten nitride layer, it can be appreciated that the WSiN layer is normally and uniformly formed even in the opened region of the tungsten silicide layer.

Figure 8:
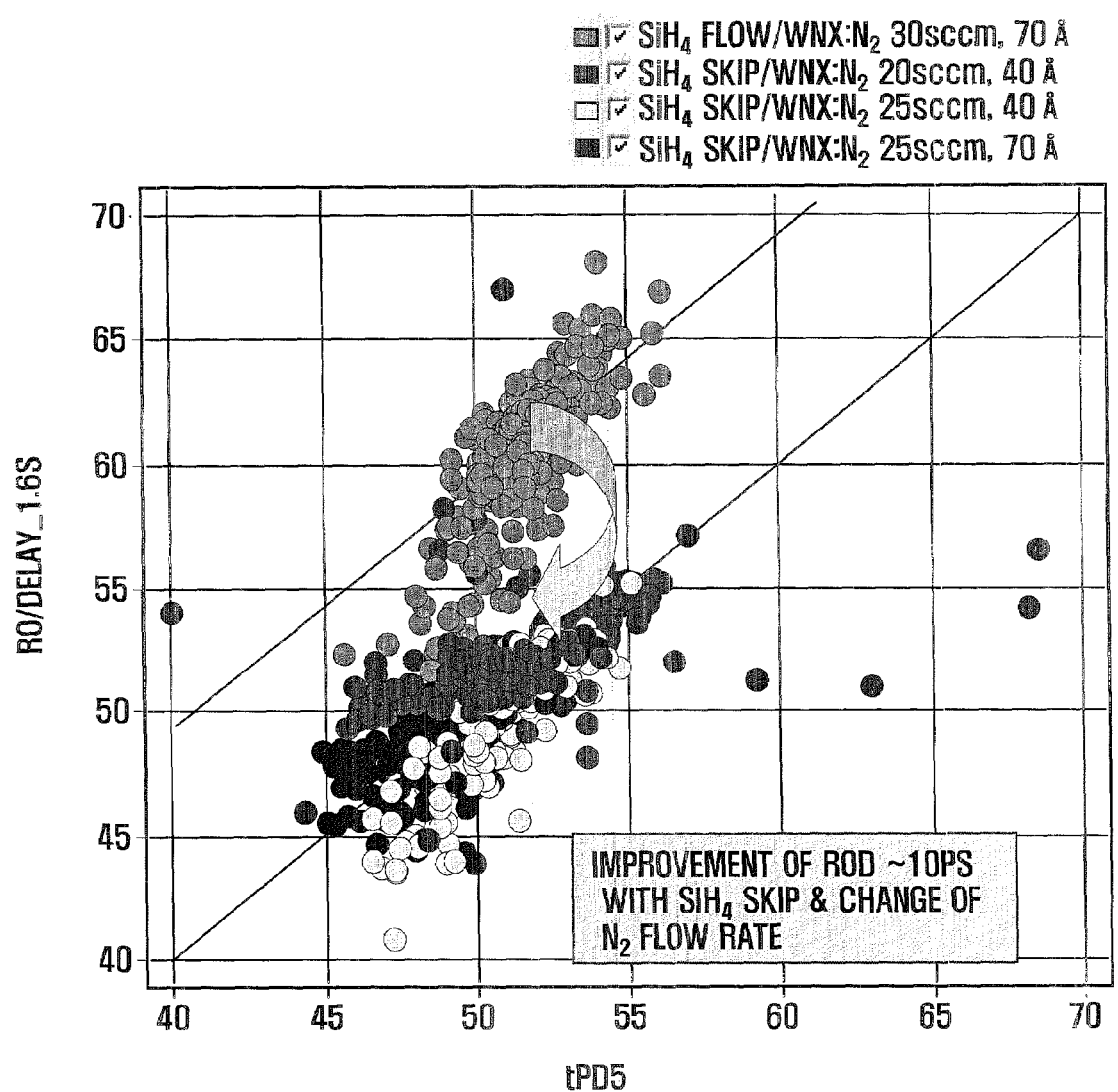
FIG. 8 illustrates a ring oscillator (RO) delay according to whether the $SiH_4$ post purge is performed or not and a nitrogen flow rate.

FIG. 8 illustrates a ring oscillator (RO) delay according to whether the SiH$_4$ post purge is performed or not and a nitrogen flow rate. In FIG. 8, reference symbol 'SiH$_4$ flow/WNx: N$_2$ 30 sccm, 70 Å' represents data of a tungsten poly gate structure that has undergone a post purge. In contrast, reference symbols 'SiH$_4$ flow/WNx:N$_2$ 20 sccm, 40 Å', 'SiH$_4$ flow/WNx:N$_2$ 25 sccm, 40 Å' and 'SiH$_4$ flow/WNx:N$_2$ 25 sccm, 70 Å' represent data of tungsten poly gate structures that has not undergone a post purge.

Referring to FIG. 8, it can be seen that the delay is improved by approximately 10 ps in the case of omitting the post purge and performing nitrogen flow than the case of performing the post purge.

In accordance with the present invention, it is possible to minimize Si—N reaction at an interface between the tungsten silicide layer and the tungsten nitride layer by omitting a post purge process that was typically performed after deposition of a tungsten silicide layer or by minimizing a nitrogen content and a thickness of the tungsten nitride layer when forming a gate having a multi-layered barrier with the tungsten silicide layer and a tungsten nitride layer. Accordingly, this reduces an interface resistance to suppress an RC delay of a transistor, thus achieving a semiconductor memory device with high-speed performance. The present invention is also applicable to a method for fabricating a bit line, a metal line or a non-volatile memory device, which employs a multi-layered barrier with a tungsten silicide layer and a tungsten nitride layer.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor memory device, the method comprising:
    forming a first layer over a substrate;
    injecting a tungsten source gas and a silicon source gas within a process chamber to form a tungsten silicide layer over the first layer;
    forming a tungsten nitride layer over the tungsten silicide layer without performing a post purge process that includes supplying a silicon source gas into the process chamber; and
    forming a second layer over the tungsten nitride layer.

2. The method of claim 1, further comprising, performing a cleaning process on the tungsten silicide layer before forming the tungsten nitride layer to avoid performing the post purge process that is operable to prevent a surface of the tungsten silicide layer from being oxidized.

3. The method of claim 1, wherein forming the tungsten nitride layer is performed within 2 hours after forming the tungsten silicide layer.

4. The method of claim 3, wherein forming the tungsten nitride layer is performed within 30 minutes after forming the tungsten silicide layer.

5. The method of claim 1, wherein the tungsten nitride layer formed is configured to have a minimum nitrogen content suitable to allow the tungsten nitride layer to have amorphous characteristics.

6. The method of claim 5, wherein the minimum nitrogen content is in a range of 10% to 50%.

7. The method of claim 1, wherein the tungsten nitride layer formed is configured to have a minimum thickness suitable to allow the tungsten nitride layer to have amorphous characteristics.

8. The method of claim 7, wherein the minimum thickness is in a range of approximately 10 Å to approximately 50 Å.

9. The method of claim 1, wherein the first layer comprises a polysilicon layer, and the second layer comprises a tungsten layer.

10. The method of claim 1, wherein the tungsten silicide layer is formed using a low pressure chemical vapor deposition (LPCVD) method.

11. The method of claim 1, wherein the silicon source gas comprises dichlorosilane ($SiH_2Cl_2$) or silane ($SiH_4$), or both.

12. The method of claim 1, wherein the tungsten nitride layer is formed using a physical vapor deposition (PVD) or an atomic layer deposition (ALD).

13. A method for fabricating a semiconductor memory device, the method comprising:

forming a first layer over a substrate;

forming a tungsten silicide layer over the first layer, wherein a post purge process is not performed after forming the tungsten silicide layer;

forming a tungsten nitride layer over the tungsten silicide layer, the tungsten nitride layer having a minimum thickness allowing the tungsten nitride to maintain amorphous characteristics; and forming a second layer over the tungsten nitride layer.

14. The method of claim 13, further comprising, performing a cleaning process to remove a native oxide layer on a surface of the tungsten silicide layer before forming the tungsten nitride layer.

15. The method of claim 13, wherein the minimum thickness is in a range of 10 Å to 50 Å.

16. The method of claim 13, wherein the tungsten nitride layer has nitrogen content in a range of 10% to 50%.

17. The method of claim 13, wherein forming the tungsten nitride layer is performed within 2 hours after forming the tungsten silicide layer.

18. The method of claim 17, wherein forming the tungsten nitride layer is performed within 30 minutes after forming the tungsten silicide layer.

19. The method of claim 13, wherein the first layer comprises a polysilicon layer, and the second layer comprises a tungsten layer.

* * * * *